United States Patent

Chaki

[11] Patent Number: 4,566,344
[45] Date of Patent: Jan. 28, 1986

[54] CLUTCH MECHANISM IN PUSHBUTTON TUNER

[75] Inventor: Takao Chaki, Tokyo, Japan

[73] Assignee: Clarion Co., Ltd., Tokyo, Japan

[21] Appl. No.: 561,864

[22] Filed: Dec. 16, 1983

[30] Foreign Application Priority Data

| Dec. 16, 1982 | [JP] | Japan | 57-190733[U] |
| Dec. 16, 1982 | [JP] | Japan | 57-190734[U] |
| Dec. 16, 1982 | [JP] | Japan | 57-190735[U] |
| Dec. 16, 1982 | [JP] | Japan | 57-190736[U] |
| Dec. 16, 1982 | [JP] | Japan | 57-190737[U] |

[51] Int. Cl.$^4$ .............................................. H03J 5/12
[52] U.S. Cl. ...................... 74/10.33; 334/7; 74/10.8
[58] Field of Search ............ 74/10.33, 10.8, 409; 334/7 R; 464/102

[56] References Cited

U.S. PATENT DOCUMENTS

| 3,964,000 | 6/1976 | Schijven | 334/74 |
| 4,194,403 | 3/1980 | Santoro | 74/10.33 |
| 4,204,179 | 5/1980 | Kataoka et al. | 334/7 R |
| 4,433,588 | 2/1984 | Watanabe et al. | 74/10.33 |
| 4,463,619 | 8/1984 | Chaki | 74/10.8 |
| 4,491,030 | 1/1985 | Chaki | 74/10.8 |

Primary Examiner—Henry C. Yuen
Attorney, Agent, or Firm—Flynn, Thiel, Boutell & Tanis

[57] ABSTRACT

The clutch mechanism in a pushbutton tuner comprises a clutch base plate including a hole, a manual tuning gear disposed at one side of the clutch base plate so as to be manually operated, an inner gear disposed at the other side of the clutch base plate and engaging the manual tuning gear through the hole to transmit rotation of the manual tuning gear to a tuning circuit element via an intermediate means to change a constant for frequency selection of the circuit element. The mechanism is particularly characterized in that the manual tuning gear is fixed to the clutch base plate by passing the rotation axle of the manual tuning gear through the hole and capturing the axle by a horseshoe-shaped stopper at the other side of the clutch base plate.

2 Claims, 16 Drawing Figures

FIG.3  FIG.4A  FIG.4B
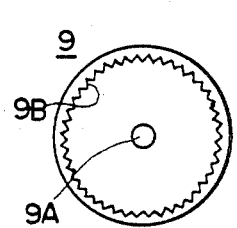
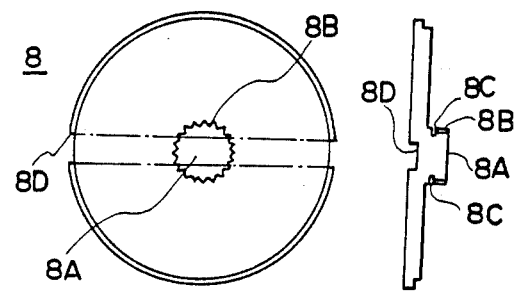
FIG.5
PRIOR ART
FIG.6
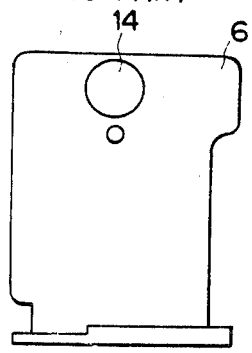
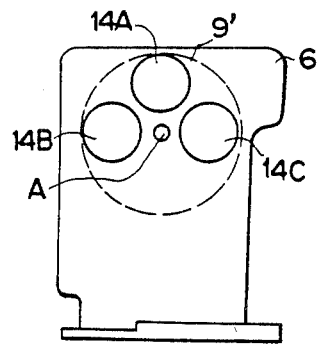
FIG.7
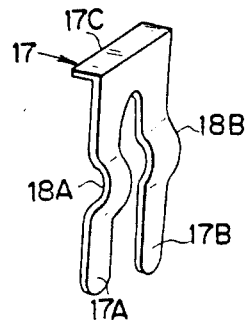

CLUTCH MECHANISM IN PUSHBUTTON TUNER

FIELD OF THE INVENTION

This invention relates to an improvement of a clutch mechanism for use in a pushbutton tuner.

BACKGROUND OF THE INVENTION

Car radios in general are adapted to be tuned manually and automatically. Manual tuning operation is effected by manually turning a tuning knob whilst automatic tuning operation is effected by merely pushing a pushbutton to which a desired broadcasting station is previously reserved. To preset a desired frequency to a pushbutton, the manual tuning knob is operated to bring a memory slide plate to a position corresponding to a desired frequency and thereafter fix a positional relation between the memory slide plate and a frequency setting plate linked to the pushbutton. Therefore, the tuning knob is used for both the manual and automatic tuning operations. The rotation of the manual tuning knob is transmitted to the memory slide plate via a clutch mechanism and further to a tuning circuit element and is therein converted to an energy for changing its constant.

Such clutch mechanism 5 as shown in FIG. 10A consists of an idler gear 10 and a wheel gear 11 engageable therewith, for example, and the idler gear 10 is shifted by a lever 4 away from the wheel gear 11 when a pushbutton 1 is pushed so that the rotation of the manual tuning knob is not conveyed to the tuning circuit element 15.

FIG. 1 schematically shows a series of constituents relating to such automatic tuning operation. When the pushbutton 1 to which a desired frequency is preset is pushed in, the movement is transmitted to the clutch mechanism 5 via an arm 2, link 3, and clutch lever 4. With this movement, the clutch mechanism operates so as not to convey a rotation of the manual tuning knob to the tuning circuit element 15. On the other hand, the memory slide plate 16 is brought to a position corresponding to the preset frequency by the pushbutton 1 and this displacement is transmitted to the tuning circuit element 15 to have it select the preset frequency.

In the prior art, however, to assemble the clutch mechanism in a tuner, both a clutch base plate and a clutch plate of the clutch mechanism must be fixed to a frame of the tuner by means of plural bolts. This disturbs laboursaving and automation of its assembly.

OBJECT OF THE INVENTION

It is therefore an object of the invention to provide a clutch mechanism which can be readily assembled in a radio set.

SUMMARY OF THE INVENTION

In accordance with the invention, there is provided a clutch mechanism in a pushbutton tuner which comprises:

a clutch base plate having a bore;

a manual turning gear disposed at one side of said clutch base plate for manual tuning operation;

an inner gear disposed at the other side of said clutch base plate and engaging said manual tuning gear through said hole to transmit rotation of said manual tuning gear to a tuning circuit element via an intermediate means to change a constant for frequency selection of said circuit element; and said manual tuning gear having a rotation axle inserted through said hole, said gear being fixed to said clutch base plate by a horseshoe-shaped stopper which captures said rotation axle at said other side of the clutch base plate.

BRIEF DESCRIPTION OF THE DRAWINGS

FIG. 3 is a plan view of an inner gear involved in the clutch mechanism;

FIGS. 4a and 4b are a plan view and a side elevation of a manual tuning gear involved in the clutch mechanism;

FIGS. 5 and 6 show different forms of a clutch base plate used in the clutch mechanism;

FIG. 7 is a perspective view of a stopper used in the clutch mechanism;

BRIEF DESCRIPTION OF THE PREFERRED EMBODIMENTS

Figure 1:
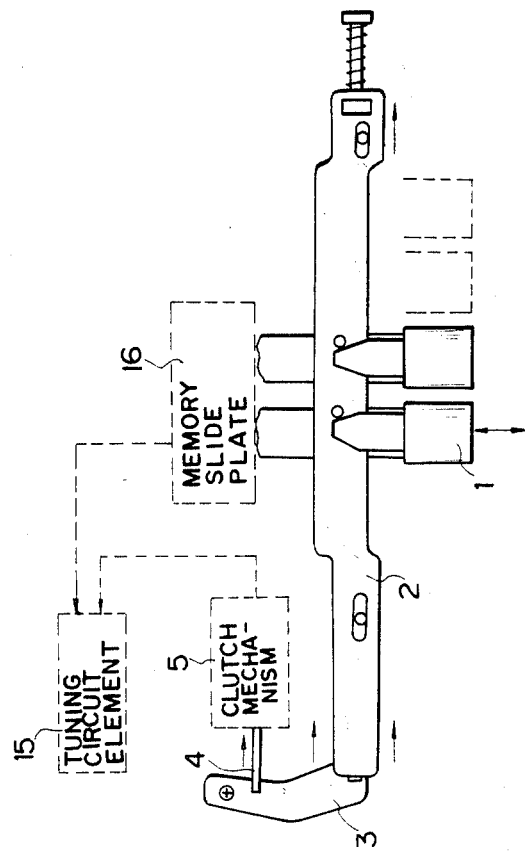
FIG. 1 is a schematic view illustrating various constituents cooperating for effecting automatic tuning operation in a pushbutton tuner.
Figure 2A:
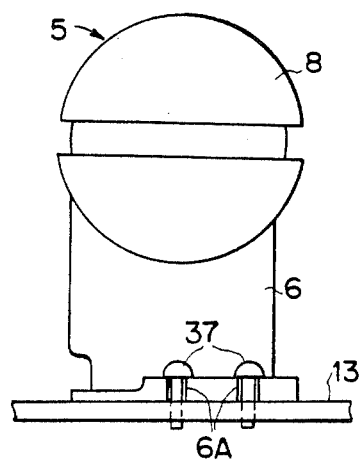
FIGS. 2a, 2b, 2c and 2d are a front elevation plan view, side elevation rear elevation of a clutch mechanism embodying the invention.
Figure 2B:
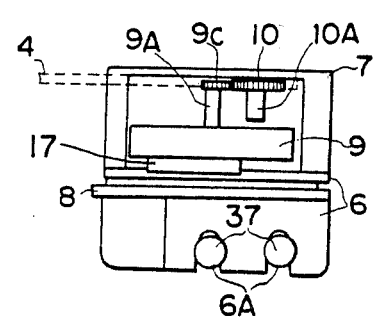
Figure 2C:
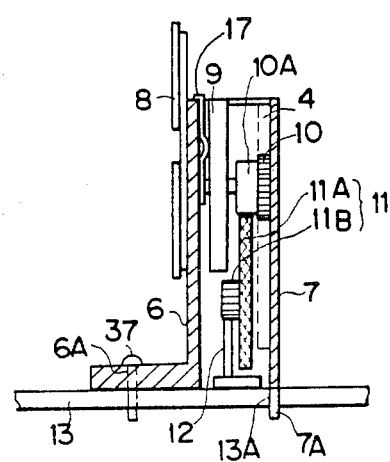
Figure 2D:
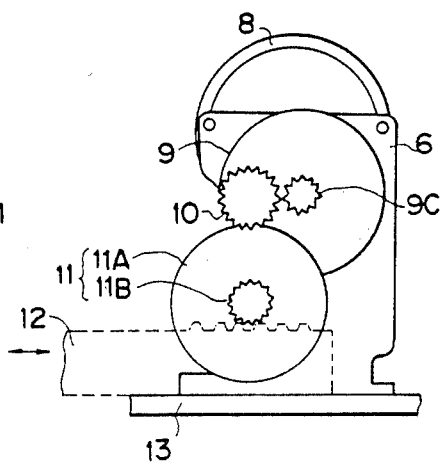

The invention will now be described in detail by way of preferred embodiments referring to the drawings.

FIGS. 2a, 2b, 2c and 2d are a front elevation, plan view, side elevation and rear elevation of a clutch mechanism for use in a pushbutton tuner embodying the invention. A clutch mechanism 5 consists of a clutch base plate 6, a clutch plate 7 and various gears combined and disposed between the two plates 6 and 7. Reference numeral 8 designates a manual tuning gear mounted on the front face of the clutch base plate to serve as a manual tuning knob. The manual tuning gear 8 is inserted through a hole formed in the clutch base plate 6 and engages an inner gear 9. The inner gear has a center rotation axle 9A extending between the clutch base plate 6 and the clutch plate 7. A gear 9C is mounted on one end of the rotation axle 9A nearer to the clutch plate 7. The manual tuning gear 8 as shown in FIGS. 4a and 4b has a center axle 8A which includes a geared circumference 8B and a circular groove 8C. A diametrical groove 8D formed back to back with the center axle 8A is to receive a manual knob therein.

Reference numeral 10 designates an idler gear rotatably mounted on the clutch plate 7 for engagement with the gear 9C. The idler gear 10 has one end 10A engaging a wheel 11A of a wheel gear 11 rotatably mounted between the clutch base plate 6 and the clutch plate 7. The wheel gear 11 also has a gear 11B engaging a rack 12 supported on an intermediate member 16 such as a memory slide plate. Reference numeral 13 denotes a frame of the tuner.

With this arrangement, if the manual tuning gear 8 is rotated, the rotation is transmitted to the memory slide plate 16 via the inner gear 9, idler gear 10 and wheel gear 11. If the pushbutton 1 is pushed in, the clutch lever 4 slightly shifts the idler gear 10 away from the wheel gear 11 so that the rotation of the manual tuning gear 8 is not transmitted to the wheel gear 11 and the latter stage members.

The clutch mechanism 5 is fixed to the frame of the tuner in the following manner.

The frame 13 is formed with a guide hole 13A. An end 7A of the clutch plate 7 is inserted in the guide hole 13A to determine the position of the clutch plate 7. Next, bolts 37 are inserted in through holes 6A formed at one end portion of the clutch base plate and fix the clutch base plate 6. This fixing method eliminates bolt-fixing of the clutch plate 7 and thereby simplifies the assembly. Additionally, this method ensures an accurate assembly work because the bolts are applied from the upper face of the frame 13 to the clutch base plate 6 which is put in the right position by engagement of the clutch plate 7. This further leads to a speedy assembly and also allows unmanned assembly.

In the prior art mechanism, the manual tuning gear 8 engages the inner gear 9 through a hole 14 formed in the clutch base plate 6 as shown in FIG. 5. This prevents a free selection of the position of the manual tuning gear 8 and also prevents reduction of the overall dimensions of the clutch mechanism.

In this connection, the present invention provides the clutch base plate 6 with a plurality of holes 14A, 14B and 14C in the area 9' corresponding to the area of the inner gear 9 so that any one of the holes may be selected for insertion of center rotation axle 8A of the manual tuning gear 8 to engage it with the inner peripheral gear 9B of the inner gear 9. The inserted manual tuning gear 8 is fixed to the clutch base plate 6 by applying a spring-forced stopper member 17 which engages the circular groove 8C of the manual tuning gear 8 and the opposed surface of the clutch base plate 6. The number of the holes of the clutch base plate 6 may be selected as desired. This structure thus permitting free selection of the position of the manual tuning gear 8 enables further reduction of the overall size of the mechanism.

As the stopper member to fix the manual tuning gear 8 to the clutch base plate 6, a horseshoe-shaped stopper 17 illustrated in FIG. 7 may be employed. The stopper 17 has a pair of parallel legs 17A and 17B bulging at the portions 18A and 18B to provide elasticity. The legs 17A and 17B are united at one end thereof and the tip of this end designated by numeral 17C is bent so as to be readily pinched by fingers. After the manual tuning gear 8 is inserted through the hole of the clutch base plate 6, the stopper 17 is mounted on the surface of the clutch base plate 6 opposed to the inner gear 9 so that the legs 17A and 17B enter in the circular groove 8C and flexibly sandwich the center axle 8A. Thus, the manual tuning gear 8 is disposed for reliable engagement with the inner gear 9. This contributes to prevention of frequency deviation. The stopper 17 can be readily removed by pinching and raising the bent tip 17C thereof.

Figure 8:
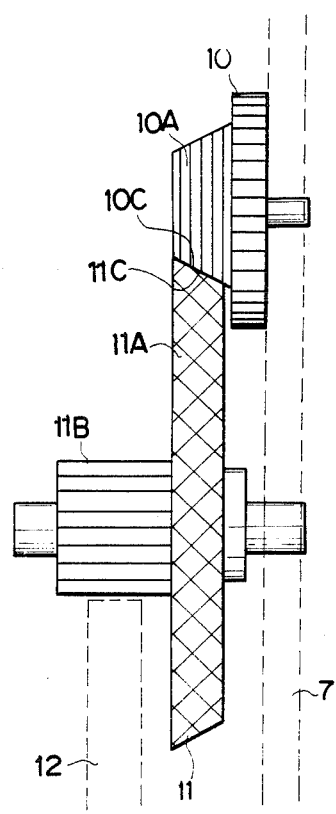
FIG. 8 is a side elevation of an idler gear, wheel gear and other cooperating members used in the clutch mechanism.

The idler gear 10 includes an end 10A to frictionally engage the wheel 11A of the wheel gear 11. Both frictional surfaces may be tapered as shown by reference numeral 10C and 11C in FIG. 8, to increase the friction areas. This construction contributes to an increase of the friction force with respect to a given spring force and ensures reliable transmission of rotation from the idler gear 10 to the wheel gear 11. Reliable rotation of the wheel gear 11 further ensures a reliable displacement of the memory slide plate 16 (FIG. 1) and thereby prevents an error of the frequency selection.

Figure 9A:
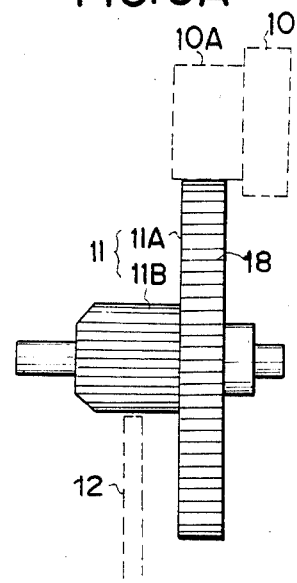
FIGS. 9a and 9b are a side elevation and a front elevation of a wheel gear used in the clutch mechanism.
Figure 9B:
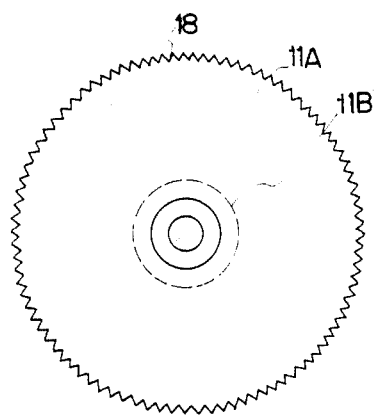

Alternatively, as shown in FIG. 9A, the friction surface of the wheel 11A of the wheel gear 11 may be provided with a number of axial grooves 18 so as to form a spur gear profile. The axial grooves 18 can be easily made by passing the wheel 11A through a drawing bench or by die casting. The grooves 18 contributes to an increase of the friction force and ensure a reliable transmission of the rotation from the idler gear 10 to the wheel gear 11.

Figure 10A:
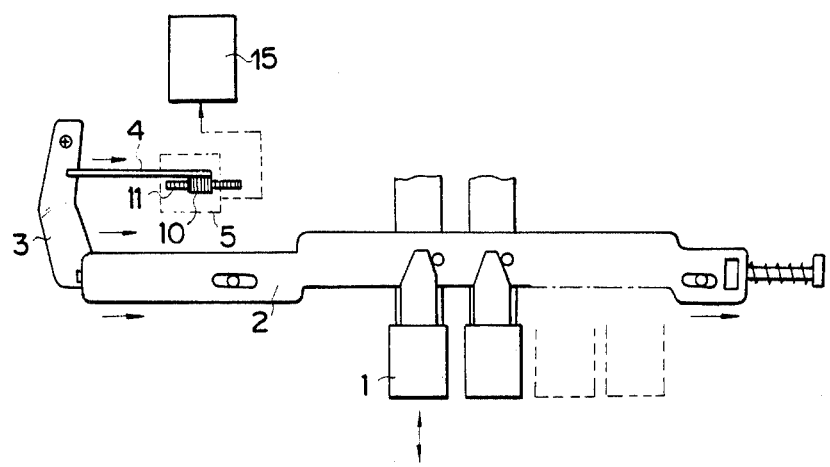
FIGS. 10a and 10b show how the clutch mechanism effects its changeover operation.
Figure 10B:
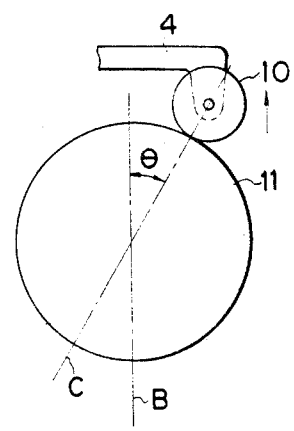

As shown in FIG. 10B, the idler gear 10 and the wheel gear 11 may be disposed so that the line C connecting the rotation axles of the both gears forms an angle $\theta°$ degrees with respect to the line B perpendicular to the surface of the frame 13. This ensures a reliable application of the transmission torque from the idler gear 10 to the wheel gear 11 when the manual tuning knob is rotated and the pushbutton 1 is in the nonoperated position. Therefore, instability of the transmission torque and frequency selection error are prevented.

The embodiments of the invention in which an exclusive property or privilege is claimed are defined as follows:

1. A clutch mechanism in a pushbutton tuner which comprises:
   a clutch base plate having at least one hole therethrough;
   a manually rotatable tuning gear disposed on one side of said clutch base plate and adapted for effecting manual tuning of the tuner, said tuning gear having a rotation axle extending through said hole;
   an inner gear disposed on the opposite side of said clutch base plate from said tuning gear and being drivingly engaged with said tuning gear so that rotational movement of said tuning gear can be transmitted to a tuning circuit element to change a constant of said circuit element;
   a horseshoe-shaped stopper engaging said rotation axle on said opposite side of said clutch base plate for securing said rotation axle with respect to said clutch base plate while permitting rotation of said tuning gear;
   a clutch plate spaced from said clutch base plate;
   an idler gear connected for simultaneous rotation with said inner gear; and
   a wheel gear having a friction surface for frictionally engaging said idler gear so that said wheel gear is rotatable with said idler gear, said friction surface being provided with a number of grooves that extend parallel to the axis thereof, both said idler gear and said wheel gear being located between said clutch plate and said clutch base plate.

2. A clutch mechanism in a pushbutton tuner having a frame, which comprises:
   a clutch base plate having at least one hole therethrough;
   a manually rotatable tuning gear disposed on one side of said clutch base plate and adapted for effecting manual tuning of the tuner, said tuning gear having a rotation axle extending through said hole;
   an inner gear disposed on the opposite side of said clutch base plate from said tuning gear and being drivingly engaged with said tuning gear so that rotational movement of said tuning gear can be transmitted to a tuning circuit element to change a constant of said circuit element;

a horseshoe-shaped stopper engaging said rotation axle on said opposite side of said clutch base plate for securing said rotation axle with respect to said clutch base plate while permitting rotation of said tuning gear;

a clutch plate spaced from said clutch base plate;

an idler gear connected for simultaneous rotation with said inner gear; and a wheel gear having a friction surface for frictionally engaging said idler gear so that said wheel gear is rotatable with said idler gear, both said idler gear and said wheel gear being located between said clutch plate and said clutch base plate, said clutch plate having engagement means at the lower end thereof engageable with said frame, said clutch base plate having mounting holes and bolts extending through said mounting holes into said frame for fixing said clutch mechanism to said frame.

* * * * *